United States Patent
Xiong

(10) Patent No.: US 11,328,638 B2
(45) Date of Patent: May 10, 2022

(54) DETECTION CIRCUIT AND SCAN DRIVE CIRCUIT

(71) Applicant: HKC CORPORATION LIMITED, Shenzhen (CN)

(72) Inventor: Zhi Xiong, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/105,560

(22) Filed: Nov. 26, 2020

(65) Prior Publication Data

US 2021/0104187 A1 Apr. 8, 2021

Related U.S. Application Data

(63) Continuation of application No. PCT/CN2018/120271, filed on Dec. 11, 2018.

(30) Foreign Application Priority Data

Nov. 29, 2018 (CN) .......................... 201811443274.2

(51) Int. Cl.
*G09G 3/00* (2006.01)
*G01R 31/52* (2020.01)
(Continued)

(52) U.S. Cl.
CPC ............. *G09G 3/006* (2013.01); *G01R 31/52* (2020.01); *G09G 2310/0267* (2013.01);
(Continued)

(58) Field of Classification Search
CPC ................. G09G 3/006; G09G 3/3266; G09G 3/3674–3681; G09G 2310/0243;
(Continued)

(56) References Cited

U.S. PATENT DOCUMENTS

2009/0109197 A1* 4/2009 Tu .......................... G09G 3/3674
345/204
2010/0019775 A1* 1/2010 Ikejiri ..................... G01R 31/52
324/537
(Continued)

FOREIGN PATENT DOCUMENTS

CN 103106881 A 5/2013
CN 104318880 A 1/2015
(Continued)

OTHER PUBLICATIONS

First Office Action in counterpart Chinese Patent Application No. 201811443274.2, dated Jan. 2, 2020.
(Continued)

*Primary Examiner* — Nathan Danielsen
(74) *Attorney, Agent, or Firm* — Westbridge IP LLC

(57) ABSTRACT

A detection circuit and a scan drive circuit are provided. The detection circuit includes a comparison circuit and a determination circuit. The comparison circuit is configured to receive a low-level voltage and a scan output signal output from an nth level buffer, and generate a first intermediate signal according to the scan output signal and the low-level voltage signal. The determination circuit is configured to receive the first intermediate signal and the scan output signal of the nth level buffer output from the output terminal of the nth level buffer in the scan chip, and generate a control signal according to the first intermediate signal and the scan input signal, and output the control signal to the scan chip to control the scan chip to cut off output when a short circuit occurs.

12 Claims, 6 Drawing Sheets

(51) Int. Cl.
*H03K 17/687* (2006.01)
*H03K 19/20* (2006.01)

(52) U.S. Cl.
CPC ..... *G09G 2330/04* (2013.01); *H03K 17/6871* (2013.01); *H03K 19/20* (2013.01)

(58) Field of Classification Search
CPC ... G09G 2310/0264; G09G 2310/0267; G09G 2310/0286–0294; G09G 2330/02; G09G 2330/028; G09G 2330/04; G09G 2330/12; G01R 31/52; H03K 17/6871; H03K 19/20
See application file for complete search history.

(56) References Cited

U.S. PATENT DOCUMENTS

2017/0278441 A1* 9/2017 Ooki .................... G09G 3/3648
2017/0316728 A1    11/2017 Lee et al.
2018/0278045 A1*  9/2018 Watanabe .............. G01R 31/52

FOREIGN PATENT DOCUMENTS

| CN | 105304050 A | 2/2016 |
| CN | 105448260 A | 3/2016 |
| CN | 105632438 A | 6/2016 |
| CN | 106340264 A | 1/2017 |
| CN | 106991988 A | 7/2017 |
| JP | 2008268615 A | 11/2008 |

OTHER PUBLICATIONS

International Search Report and Written Opinion in corresponding PCT Application No. PCT/CN2018/120271, dated Aug. 30, 2019.
Second Office Action in counterpart Chinese Patent Application No. 201811443274.2, dated May 15, 2020.

* cited by examiner the scan chip turns on corresponding rows the scan chip turns off corresponding rows

DETECTION CIRCUIT AND SCAN DRIVE CIRCUIT

CROSS REFERENCES TO RELATED APPLICATIONS

The present application is a continuation application of International Application No. PCT/CN2018/120271, filed Dec. 11, 2018, which claims the priority of Chinese patent application filed on Nov. 29, 2018, with application number 201811443274.2, entitled "Detection Circuit and Scan Drive Circuit", the full content of which is incorporated herein by reference.

FIELD

The present application relates to display field, and particularly to a detection circuit and a scan drive circuit.

BACKGROUND

The statements here only provide background information related to the present application, and do not necessarily constitute prior art.

With the development of displays towards to large-size, high-definition, and high-resolution, as well as the raising of requirements on display quality, high Pixels Per Inch (PPI, the number of pixels per inch) makes signal lines thinner and spacing between signal lines smaller, so the probability of a short circuit between the signal lines is increased rapidly.

In a display panel, a scan chip is generally used as a panel scan drive. The scan chip is connected to the scan lines in the display panel. When a short circuit occurs between adjacent scan lines, there is a conduction path between the adjacent scan lines. Since the scan working voltage includes a high-level voltage signal and a low-level voltage signal, a conducted circuit is established between the high-level voltage signal and the low-level voltage signal when a short circuit occurs, so that the scan chip will be burnt out.

SUMMARY

Based on the above, the present application provides a detection circuit and a scan drive circuit to improve the situation that the scan chip will be burnt out due to a short circuit between the scan lines.

The present application provides a detection circuit, the detection circuit includes:

a comparison circuit, a first input terminal of the comparison circuit connected to an output terminal of an nth level buffer in a scan chip being configured to receive a scan output signal output from the output terminal of the nth level buffer, and a second input terminal of the comparison circuit being configured to receive the low-level voltage signal, and the comparison circuit being configured to generate a first intermediate signal according to the scan output signal and the low-level voltage signal received; and a determination circuit, a first input terminal of the determination circuit connected to an output terminal of the comparison circuit being configured to receive the first intermediate signal output from the output terminal of the comparison circuit, a second input terminal of the determination circuit connected to an input terminal of the nth level buffer in the scan chip being configured to receive the scan input signal of the nth level buffer output from the input terminal of the nth level buffer in the scan chip, the determination circuit being configured to generate a control signal according to the first intermediate signal and the scan input signal of the nth level buffer received, and output the control signal to the scan chip to control the scan chip to cut off output when a short circuit occurs.

In one embodiment, the comparison circuit includes:

a comparison branch, a first input terminal of the comparison branch connected to the output terminal of the nth level buffer in the scan chip being configured to receive the scan output signal output from the output terminal of the nth level buffer, and a second input terminal of the comparison branch being configured to receive the low-level voltage signal, and the comparison branch being configured to generate the first intermediate signal according to the scan output signal and the low-level voltage signal received.

In one embodiment, the determination circuit includes:

a signal processing branch, an input terminal of the signal processing branch connected to the input terminal of the nth level buffer in the scan chip being configured to receive the scan input signal of the nth level buffer output from the input terminal of the nth level buffer in the scan chip, and reverse the scan input signal of the nth level buffer; and a logic determination branch, a first input terminal of the logic determination branch connected to the output terminal of the comparison branch being configured to received the first intermediate signal, a second input terminal of the logic determination branch connected to the input terminal of the signal processing branch being configured to receive the scan input signal of the nth level buffer after being reversed, the logic determination branch being configured to generate the control signal according to the first intermediate signal and the scan input signal of the nth level buffer after being reversed, and output the control signal to the scan chip.

In one embodiment, the comparison branch includes a comparator, a positive input terminal of the comparator being connected to the output terminal of the nth level buffer in the scan chip, a negative input terminal of the comparator being configured to receive the low-level voltage signal, and the output terminal of the comparator being connected to the first input terminal of the logical determination branch.

In one embodiment, the logical determination branch includes an AND circuit device, a first input terminal of the AND circuit device being connected to the output terminal of the comparator, and a second input terminal of the AND circuit device being connected to the output terminal of the inverter.

In one embodiment, the comparison circuit includes:

a comparison branch, a first input terminal of the comparison branch connected to the output terminal of the nth level buffer in the scan chip being configured to receive the scan output signal output from the output terminal of the nth level buffer, and a second input terminal of the comparison branch connected to the low-level voltage signal being configured to receive the low-level voltage signal, the comparison branch being configured to generate a comparison signal according to the scan output signal and the low-level voltage signal received;

a signal processing branch, an input terminal of the signal processing branch connected to an output terminal of the comparison branch being configured to receive the comparison signal and reverse the comparison signal to generate the first intermediate signal, an output terminal of the signal processing branch connected to the first input terminal of the determination circuit being configured to provide the first intermediate signal to the determination circuit.

In one embodiment, the determination circuit includes:

a logic determination branch, a first input terminal of the logic determination branch connected to the output terminal of the signal processing branch being configured to receive the first intermediate signal, a second input terminal of the logic determination branch connected to the input terminal of the nth level buffer in the scan chip being configured to receive the scan input signal of the nth level buffer, the logic determination branch being configured to generate the control signal according to the first intermediate signal and the scan input signal of the nth level buffer received and output the control signal to the scan chip.

In one embodiment, the comparison branch includes a comparator, the signal processing branch includes an inverter, wherein, a positive input terminal of the comparator is connected to the output terminal of the nth level buffer in the scan chip, a negative input terminal of the comparator is configured to receive the low-level voltage signal, and an output terminal of the comparator is connected to an input terminal of the inverter.

In one embodiment, the logical determination branch includes an AND circuit device, a first input terminal of the AND circuit device being connected to the output terminal of the inverter, and a second input terminal of the AND circuit being connected to the output terminal of the nth level buffer in the scan chip.

Based on a same invention concept, the present application also provides a scan drive circuit, the scan drive circuit includes at least one detection circuit.

The detection circuit includes:

a comparison circuit, a first input terminal of the comparison circuit connected to an output terminal of an nth level buffer in a scan chip being configured to receive a scan output signal output from the output terminal of the nth level buffer, and a second input terminal of the comparison circuit being configured to receive the low-level voltage signal, and the comparison circuit being configured to generate a first intermediate signal according to the scan output signal and the low-level voltage signal received; and a determination circuit, a first input terminal of the determination circuit connected to an output terminal of the comparison circuit being configured to receive the first intermediate signal output from the output terminal of the comparison circuit, a second input terminal of the determination circuit connected to an input terminal of the nth level buffer in the scan chip being configured to receive the scan input signal of the nth level buffer output from the input terminal of the nth level buffer in the scan chip, the determination circuit being configured to generate a control signal according to the first intermediate signal and the scan input signal of the nth level buffer received, and output the control signal to the scan chip to control the scan chip to cut off output when a short circuit occurs.

In one embodiment, the comparator includes:

a comparison branch, a first input terminal of the comparison branch connected to the output terminal of the nth level buffer in the scan chip being configured to receive the scan output signal output from the output terminal of the nth level buffer, and a second input terminal of the comparison branch being configured to receive the low-level voltage signal, and the comparison branch being configured to generate the first intermediate signal according to the scan output signal and the low-level voltage signal received.

In one embodiment, the determination circuit includes:

a signal processing branch, an input terminal of the signal processing branch connected to the input terminal of the nth level buffer in the scan chip being configured to receive the scan input signal of the nth level buffer output from the input terminal of the nth level buffer in the scan chip, and reverse the scan input signal of the nth level buffer; and a logic determination branch, a first input terminal of the logic determination branch connected to the output terminal of the comparison branch being configured to receive the first intermediate signal, a second input terminal of the logic determination branch connected to the input terminal of the signal processing branch being configured to receive the scan input signal of the nth level buffer after being reversed, the logic determination branch being configured to generate the control signal according to the first intermediate signal and the scan input signal of the nth level buffer after being reversed, and output the control signal to the scan chip.

In one embodiment, the comparison branch includes a comparator, a positive input terminal of the comparator being connected to the output terminal of the nth level buffer in the scan chip, a negative input terminal of the comparator being configured to receive the low-level voltage signal, and the output terminal of the comparator being connected to the first input terminal of the logical determination branch.

In one embodiment, the logical determination branch includes an AND circuit device, a first input terminal of the AND circuit device being connected to the output terminal of the comparator, and a second input terminal of the AND circuit device being connected to the output terminal of the inverter.

In one embodiment, the comparator includes:

a comparison branch, a first input terminal of the comparison branch connected to the output terminal of the nth level buffer in the scan chip being configured to receive the scan output signal output from the output terminal of the nth level buffer, and a second input terminal of the comparison branch connected to the low-level voltage signal being configured to receive the low-level voltage signal, the comparison branch being configured to generate a comparison signal according to the scan output signal and the low-level voltage signal received;

a signal processing branch, an input terminal of the signal processing branch connected to an output terminal of the comparison branch being configured to receive the comparison signal and reverse the comparison signal to generate the first intermediate signal, an output terminal of the signal processing branch connected to the first input terminal of the determination circuit being configured to provide the first intermediate signal to the determination circuit.

In one embodiment, the determination circuit includes:

a logic determination branch, a first input terminal of the logic determination branch connected to the output terminal of the signal processing branch being configured to receive the first intermediate signal, a second input terminal of the logic determination branch connected to the input terminal of the nth level buffer in the scan chip being configured to receive the scan input signal of the nth level buffer, the logic determination branch being configured to generate the control signal according to the first intermediate signal and the scan input signal of the nth level buffer received and output the control signal to the scan chip.

In one embodiment, the comparison branch includes a comparator, the signal processing branch includes an inverter, wherein a positive input terminal of the comparator is connected to the output terminal of the nth level buffer in the scan chip, a negative input terminal of the comparator is configured to receive a low-level voltage signal, and the output terminal of the comparator is connected to an input terminal of the inverter.

In one embodiment, the logical determination branch includes an AND circuit device, a first input terminal of the AND circuit device being connected to the output terminal of the inverter, and a second input terminal of the AND circuit device being connected to the output terminal of the nth level buffer in the scan chip.

As mentioned-above, the present application provides a detection circuit and a scan drive circuit. The detection circuit includes a comparison circuit and a determination circuit. A first input terminal of the comparison circuit connected to an output terminal of an nth level buffer in a scan chip is configured to receive a scan output signal output from an output terminal of the nth level buffer, and a second input terminal of the comparison circuit is configured to receive a low-level voltage signal, the comparison circuit is configured to generate a first intermediate signal according to the scan output signal and the low-level voltage signal received. A first input terminal of the determination circuit is connected to an output terminal of the comparison circuit and is configured to receive the first intermediate signal output from the output terminal of the comparison circuit, and a second input terminal of the determination circuit is connected to an input terminal of the nth level buffer in the scan chip and is configured to receive the scan input signal of the nth level buffer output from the input terminal of the nth level buffer in the scan chip, the determination circuit is configured to generate a control signal according to the first intermediate signal and the scan input signal of the nth level buffer, and output the control signal to the scan chip to control the scan chip to cut off output when a short circuit occurs. In the present application, the comparison circuit generates a first intermediate signal according to the low-level voltage signal and the scan output signal output from the output terminal of the nth level buffer, and the determination circuit generates a control signal according to the first intermediate signal and the scan input signal of the nth level buffer, and outputs the control signal to the scan chip to control the scan chip to cut off output when a short circuit occurs, thereby avoiding burning out the scan chip due to a short circuit between scan lines.

DETAILED DESCRIPTION OF THE EMBODIMENTS

In order to make the above purposes, features and advantages of the present application more obvious and understandable, the specific implementation of the present application will be described in detail below in conjunction with the drawings. More specific details are set forth as below to facilitating understanding of the present application. However, the present application can be implemented in many other ways different from those described herein, and those skilled in the art can make similar improvements without departing from the connotation of the present application. Therefore, this application won't be limited by the specific implementation disclosed below.

Figure 1:
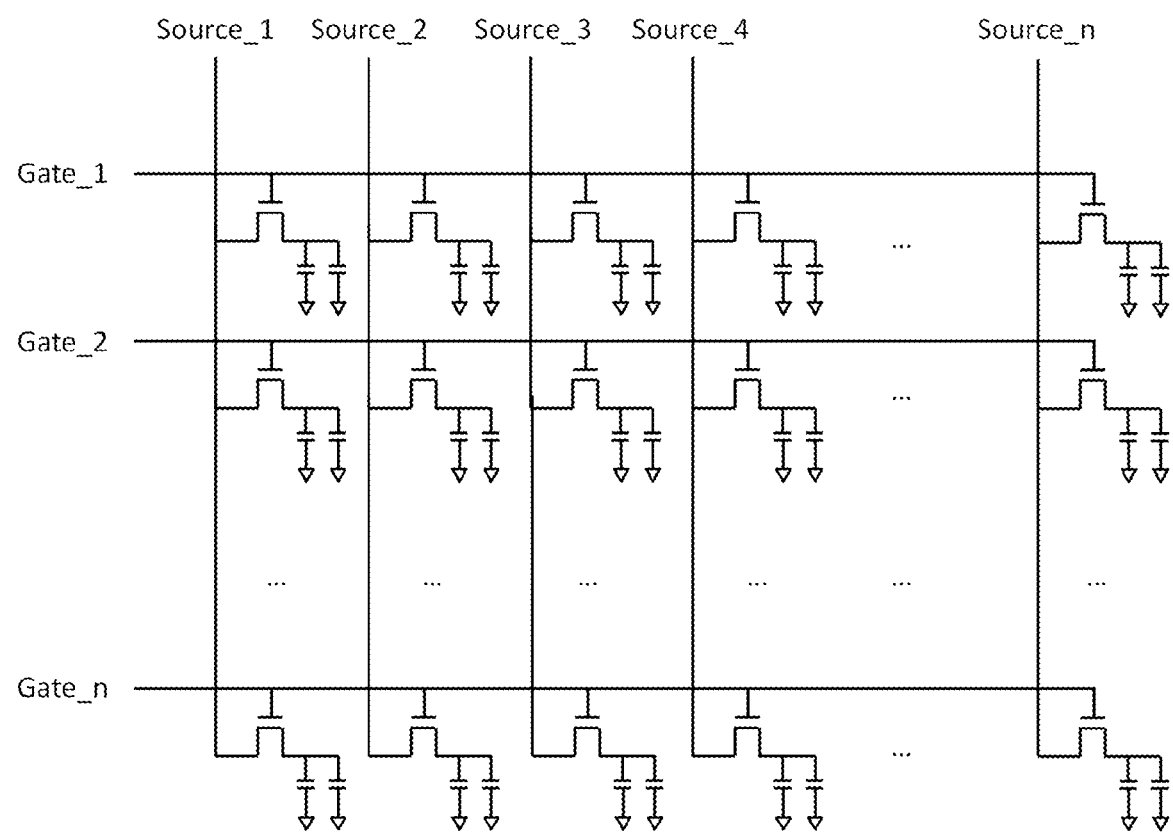
FIG. 1 is a schematic diagram of connection ways of signal lines in a display panel.
Figure 2:
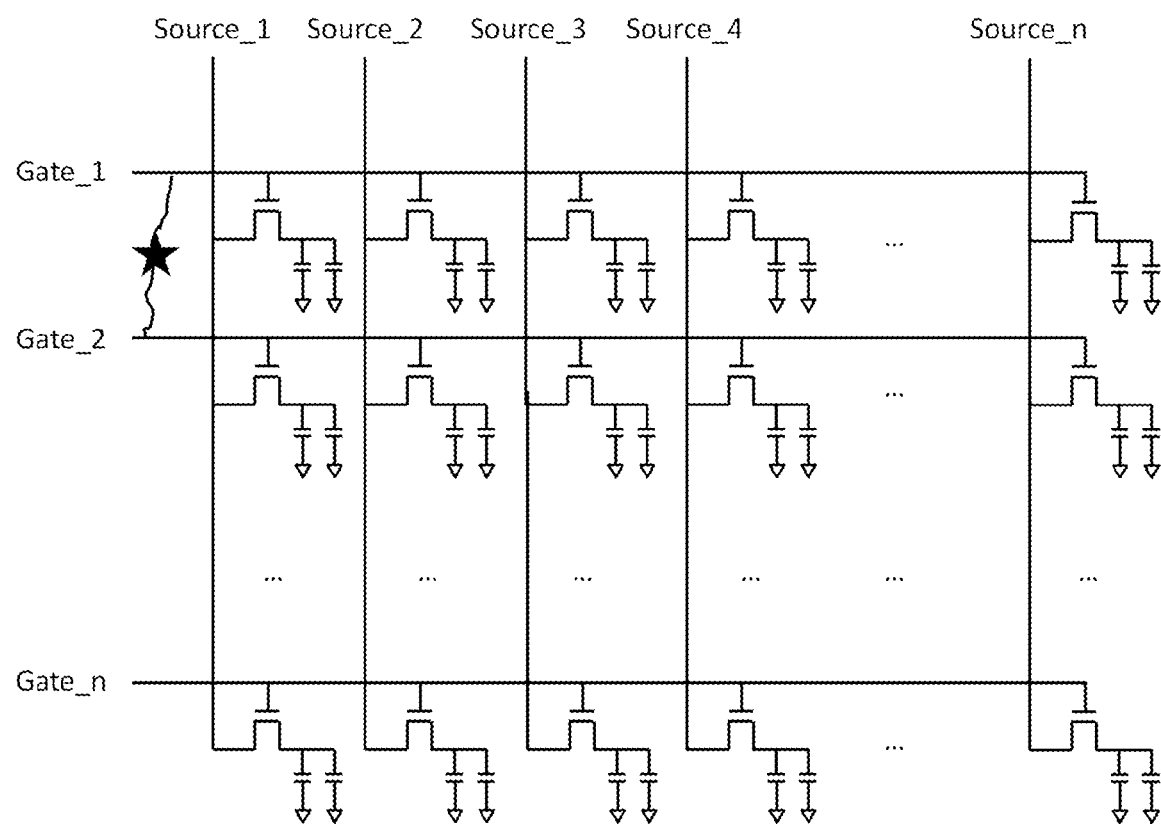
FIG. 2 is a schematic diagram of a short circuit occurring between adjacent scan lines in a display panel.

With the development of displays towards to large-scale, high-definition, and high-resolution, as well as the raising of requirements on display quality, high Pixels Per Inch (PPI, the number of pixels per inch) makes signal lines thinner and spacing between signal lines smaller. In a common display, the data lines, scan lines, and pixels are connected as shown in FIG. 1. High PPI makes the spacing between adjacent signal lines smaller, thereby resulting in a rapid increasing of the probability of short circuits occurring between adjacent signal lines, please refer to FIG. 2, the asterisk in FIG. 2 represents that a short circuit occurs between two adjacent scan lines.

Figure 3:
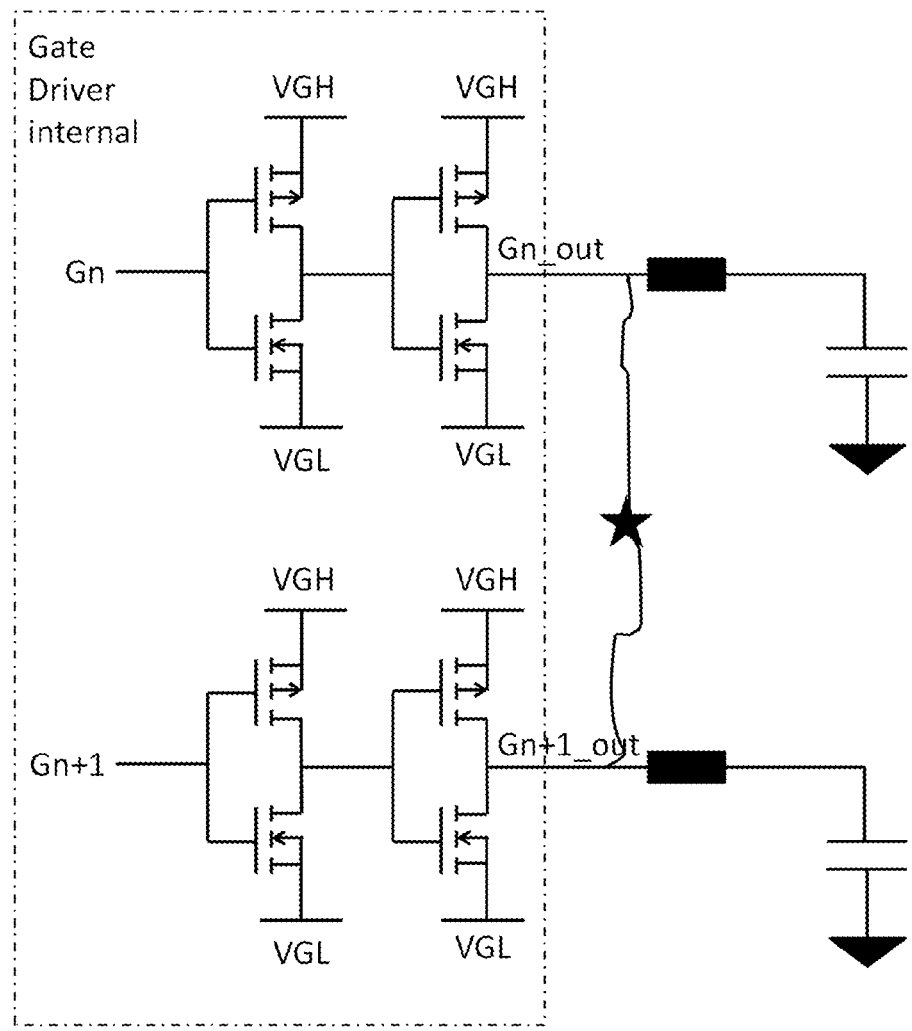
FIG. 3 is a schematic diagram of connection ways of the scan chip and the scan lines.

In the display adopts a scan chip as the panel scan drive, and its internal structure is shown in FIG. 3. The scan chip uses a buffer D4 formed by a 2-level (can be set as required) inverter to connect to scan lines in the display area of the panel. The scan chip is connected to the scan lines. When a short circuit occurs between adjacent scan lines, that is, there is a conduction path between adjacent scan lines, since the scan working voltages are high-level voltage signals VGH and low-level voltage signals VGL, the high-level voltage signals VGH and the low-level voltage signals VGL are conducted when there is a short circuit, which results in burning out the scan chip.

Figure 4:
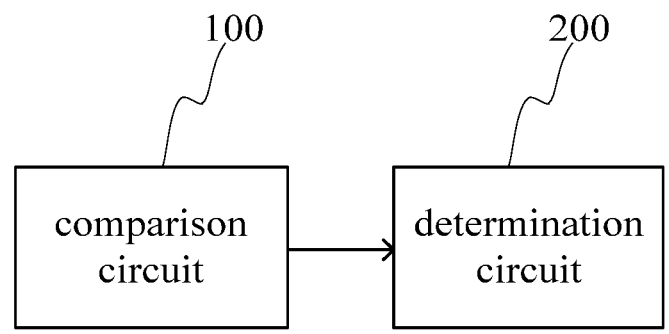
FIG. 4 is a structural schematic diagram of a detection circuit provided according to an embodiment of the present application.

In order to solve the above-mentioned problems, the present application provides a detection circuit. Please refer to FIG. 4, the detection circuit includes a comparison circuit 100 and a determination circuit 200.

A first input terminal of the comparison circuit 100 is connected to an output terminal of an nth level buffer D4 in a scan chip and is configured to receive a scan output signal G_out output from the output terminal of the nth level buffer D4, and a second input terminal of the comparison circuit 100 is configured to receive a low-level voltage signal VGL. The comparison circuit 100 is configured to generate a first intermediate signal according to the scan output signal G_out and the low-level voltage signal VGL received.

A first input terminal of the determination circuit 200 is connected to an output terminal of the comparison circuit 100 and is configured to receive the first intermediate signal output from the output terminal of the comparison circuit 100, a second input terminal of the determination circuit 200 is connected to an input terminal of the nth level buffer D4 in the scan chip and is configured to receive a scan input signal G_in of the nth level buffer D4 output from the input terminal of the nth level buffer D4 in the scan chip. The determination circuit 200 is configured to generate a control signal according to the first intermediate signal and the scan input signal G-in of the nth level buffer D4 received and output the control signal to the scan chip to control the scan chip to cut off output when a short circuit occurs.

It should be understood that the comparison circuit 100 generates a first intermediate signal according to the low-level voltage signal VGL and the scan output signal G_out output from the output terminal of the nth level buffer D4, and the determination circuit 200 generates a control signal according to the first intermediate signal and the scan input signal of the nth level buffer D4, and outputs the control signal to the scan chip to control the scan chip to cut off output when a short circuit occurs, thereby avoiding burning out the scan chip due to a short circuit between scan lines.

Figure 5:
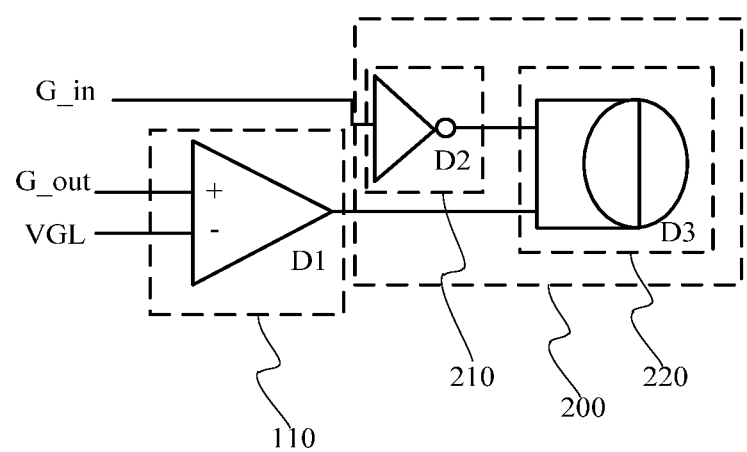
FIG. 5 is a structural schematic diagram of another detection circuit provided according to an embodiment of the present application.

Please refer to FIG. 5, in one of the embodiments, the comparison circuit 100 includes a comparison branch 110, a first input terminal of the comparison branch 110 is connected to the output terminal of the nth level buffer D4 in the scan chip and is configured to receive the scan output signal G_out output from the output terminal of the nth level buffer D4, and a second input terminal of the comparison branch 110 is configured to receive the low-level voltage signal VGL, and an output terminal of the comparison branch 110 is connected to the first input terminal of the determination circuit 200. The comparison branch 110 is configured to generate the first intermediate signal according to the scan output signal G_out and the low-level voltage signal VGL received.

In one of the embodiments, the determination circuit 200 includes a signal processing branch 210 and a logic determination branch 220.

An input terminal of the signal processing branch 210 is connected to the input terminal of the nth level buffer D4 in the scan chip, and the signal processing branch 210 is configured to receive the scan input signal G_in of the nth level buffer D4 output from the input terminal of the nth level buffer D4 in the scan chip, and reverse the scan input signal G_in of the nth level buffer D4.

A first input terminal of the logic determination branch 220 is connected to the output terminal of the comparison branch 110, a second input terminal of the logic determination branch 220 is connected to an output terminal of the signal processing branch 210. The logic determination branch 220 is configured to receive the first intermediate signal and the scan input signal G_in of the nth level buffer D4 after being reversed, generate the control signal according to the first intermediate signal and the scan input signal G_in of the nth level buffer D4 after being reversed, and output the control signal to the scan chip.

In one of the embodiments, the comparison branch 110 includes a comparator D1. A positive input terminal of the comparator D1 is connected to the output terminal of the nth level buffer D4 in the scan chip, a negative input terminal of the comparator D1 is configured to receive the low-level voltage signal VGL, and an output terminal of the comparator D1 is connected to the first input terminal of the logical determination branch.

It should be understood that when the scan output signal G_out output from the output terminal of the nth level buffer D4 in the scan chip is high-level, the comparator generates and outputs a comparison signal of high-level according to the scan output signal G_out and the low-level voltage signal VGL and outputs the comparison signal of high-level, that is, the first intermediate signal is a high-level signal. When the scan output signal G_out output from the output terminal of the nth level buffer D4 in the scan chip is low-level, the comparator D1 generates a comparison signal of low-level according to the scan output signal G_out and the low-level voltage signal VGL and outputs the comparison signal of low-level, that is, the first intermediate signal is a low-level voltage signal.

In one of the embodiments, the signal processing branch 210 includes an inverter D2, an input terminal of the inverter D2 is connected to the input terminal of the nth level buffer D4 in the scan chip, an output terminal of the inverter D2 is connected to the second input terminal of the logic determination branch 220.

It should be understood that when the scan input signal G_in of the nth level buffer D4 output from the input terminal of the nth level buffer D4 in the scan chip is a high-level signal, after the scan input signal G_in is reversed by the inverter D2, the scan input signal G_in of the nth level buffer D4 after being reversed and output by the inverter by D2 is a low-level voltage signal. When the scan input signal G_in of the nth level buffer D4 output from the input terminal of the nth level buffer D4 in the scan chip is a low-level voltage signal, after the scan input signal G_in is reversed by the inverter, the scan input signal G_in of the nth level buffer D4 after being reversed and output by the inverter D2 is a high-level signal.

In one of the embodiments, the logic determination branch 220 includes an AND circuit device D3. A first input terminal of the AND circuit device D3 is connected to the output terminal of the comparator D1, and a second input terminal of the AND circuit device D3 is connected to the output terminal of the inverter D2.

It should be understood that when signals input to the first input terminal and the second input terminal of the AND circuit device D3 are both high-level signals or both low-level signals, an output terminal of the AND circuit device D3 outputs 1, that is, the control signal is a high-level signal. When the signal input to the first input terminal of the AND circuit device D3 is a high-level signal, and the signal input to the second input terminal of the AND circuit device D3 is a low-level voltage signal, or when the signal input to the first input terminal of the AND circuit device D3 is a low-level voltage signal and the signal input to the second input terminal of the AND circuit device D3 is a high-level signal, the output terminal of the AND circuit device D3 outputs 0, that is, the control signal is a low-level voltage signal.

Figure 6:
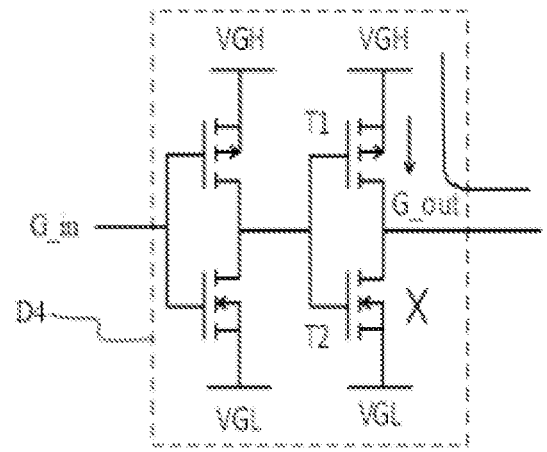
FIG. 6 is a structural schematic diagram of working principle of the scan chip.
Figure 6:
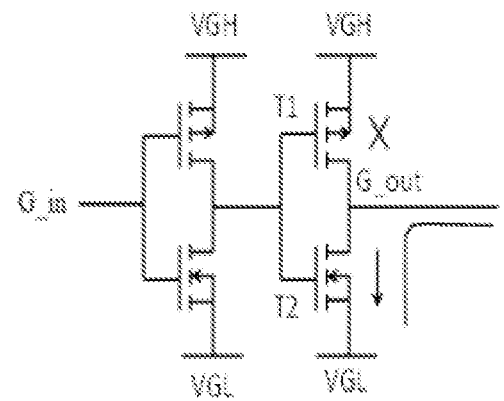

Please refer to FIG. 6, the scan chip includes an N level buffer D4. When the scan chip needs to turn on an nth row scan line (where n and N are integers greater than or equal to 1, and $1 \leq n \leq N$), the scan input signal G_in from the input terminal of the nth level buffer D4 is a high-level signal, a first switch tube T1 (which is an N-type FET) is turned on, and a second switch tube T2 (which is a P-type FET) is turned off, then the nth level buffer D4 in the scan chip outputs a high-level voltage signal VGH to the nth row scan line. When scanning to the next row or another row, the first switch tube T1 (which is the N-type FET) of the nth level buffer D4 is turned off, and the second switch tube T2 (which is the P-type FET) is turned on, then the scan output signal G_out output from the output terminal of the nth level buffer D4 in the scan chip is a low-level voltage signal VGL and is provided to the nth row scan line.

When a short circuit occurs between scan lines (it is assumed that a short circuit occurs between an nth row scan line and an (n+1)th row scan line), when the scan chip needs to turn on (n+1)th row scan line, a low-level voltage signal VGL is provided to the nth row scan line by an nth level buffer D4, and a high-level signal VGH is provided to the (n+1)th row scan line by an (n+1)th level buffer D4. However, since a short circuit occurs between the nth row scan line and the (n+1)th row scan line, the voltage of the output terminal of the nth level buffer D4 approaches the voltage of the high-level voltage signal VGH, and is larger than the low level voltage signal VGL.

In this embodiment, in a normal working state, when the scan chip needs to turn on the nth row scan line, the out terminal of the nth level buffer D4 outputs a high-level voltage signal VGH, and a first intermediate signal generated by the comparator D1 according to the high-level voltage signal VGH and the low-level voltage signal VGL is a high-level signal. The input terminal of the inverter D2 receives the high-level voltage signal VGH, and the high-level voltage signal VGH is reversed to a low-level voltage signal, that is, the first input terminal of the AND circuit device D3 receives a high-level signal, and the second input terminal of the AND circuit device receives a low-level voltage signal, thus, the AND circuit device D3 outputs 0, that is, the control signal is a low-level voltage signal. When the scan chip needs to turn on another scan lines, the out terminal of the nth level buffer D4 outputs a high-level voltage signal VGL, and a first intermediate signal output from the comparator D1 is a low-level voltage signal. A low-level voltage signal is input to the input terminal of the inverter D2, and the inverter D2 outputs a high-level signal, that is, the first input terminal of the AND circuit device D3 receives a low-level voltage signal, and the second input terminal of the AND circuit receives a high-level signal, thus the AND circuit device D3 outputs 0, that is, the control signal is a low-level voltage signal.

If a short circuit occurs between the nth row scan line and its adjacent scan line, it is assumed that a short circuit occurs between the nth row scan line and the (n+1)th row scan line. When the scan chip needs to turn on the nth row scan line, the out terminal of the nth level buffer D4 outputs a high-level voltage signal VGH, a first intermediate signal generated by the comparator D1 according to the high-level signal VGH and the low-level voltage signal VGL is a high-level signal. The input terminal of the inverter D2 receives the high-level signal VGH, and the high-level signal VGH is reversed to a low-level voltage signal, that is, a high-level signal is input to the first input terminal of the AND circuit device D3, and a low-level voltage signal is input to the second input terminal of the AND circuit device, thus the AND circuit device D3 outputs 0, that is, the control signal is a low-level voltage signal.

When the scan chip needs to turn on (n+1)/(n−1)th row scan line, the (n+1)/(n−1)th level buffer D4 outputs a high-level voltage signal VGH, the out terminal of the nth level buffer D4 outputs a low-level voltage signal VGL. However, since a short circuit occurs between the nth row scan line and the (n+1)/(n−1)th row scan line, the voltage of the output terminal of the nth level buffer D4 approaches the high-level voltage signal VGH and is larger than the lower level voltage signal VGL. Thus, at this time the first intermediate signal output from the comparator D1 is a high-level signal. A low-level voltage signal is input to the input terminal of the inverter D2, and the inverter D2 outputs a high-level signal, that is, the first input terminal of the AND circuit device D3 receives a high-level signal, and the second input terminal of the AND circuit receives a high-level signal. Thus, the scan chip can turn off according to the control signal when a short circuit occurs, thereby avoiding burning out the scan chip due to a short circuit between scan lines.

Figure 7:
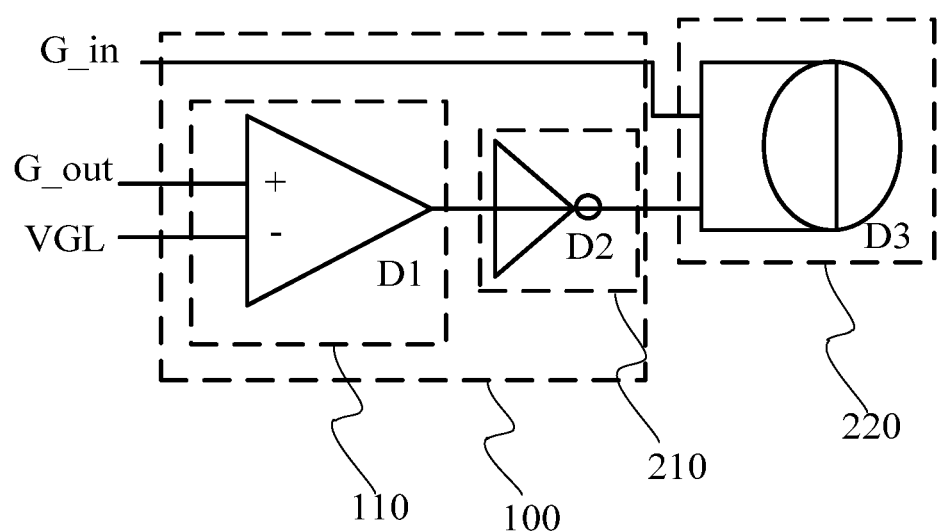
FIG. 7 is a structural schematic diagram of still another detection circuit provided according to an embodiment of the present application.

In one of the embodiments, please refer to FIG. 7, the comparison circuit 100 includes a comparison branch 110 and a signal processing branch 210.

A first input terminal of the comparison branch 110 is connected to an output terminal of the nth level buffer D4 in the scan chip and is configured to receive the scan output signal G_out output from the output terminal of the nth level buffer D4, and a second input terminal of the comparison branch 110 is configured to receive a low-level voltage signal VGL. The comparison branch 110 is configured to generate a comparison signal according to the scan output signal G_out and the low-level voltage signal VGL received.

An input terminal of the signal processing branch 210 is connected to an output terminal of the comparison branch 110 and is configured to receive the comparison signal, and reverses the comparison signal to generate the first intermediate signal, an output terminal of the signal processing branch 210 is connected to the first input terminal of the determination circuit 200 and is configured to provide the first intermediate signal to the determination circuit.

In this embodiment, the determination circuit 200 includes a logic determination branch 220, a first input terminal of the logic determination branch 220 is connected to an output terminal of the signal processing branch 210, and a second input terminal of the logic determination branch 220 is connected to an input terminal of the nth level buffer D4 in the scan chip. The logic determination branch 220 is configured to receive the first intermediate signal and the scan input signal G_in of the nth level buffer D4, and generate the control signal according to the first intermediate signal and the scan input signal G_in of the nth level buffer D4, and output the control signal to the chip signal.

In one of embodiments, the comparison branch 110 includes a comparator D1. The signal processing branch 210 includes an inverter D2. The logic determination branch 220 includes an AND circuit device D3.

A positive input terminal of the comparator D1 is connected to the output terminal of the nth level buffer D4 in the scan chip, a negative input terminal of the comparator D1 is configured to receive the low-level voltage signal VGL, and an output terminal of the comparator is connected to an input terminal of the inverter D2.

A first input terminal of the AND circuit device D3 is connected to the output terminal of the inverter D2, and a second input terminal of the AND circuit device is connected to the input terminal of the nth level buffer D4 in the scan chip.

In this embodiment, in normal working state, when the scan chip needs to turn on an nth row scan line, the out terminal of the nth level buffer D4 outputs the high-level voltage signal VGH, and the comparator D1 generates the comparison signal of high-level according to the high-level signal VGH and the low-level voltage signal VGL, the inverter D2 reverses the comparison signal of the high-level to generate the first intermediate signal of low-level, that is, the signal input to the first input terminal of the AND circuit device D3 is a low-level voltage signal. The signal input to the second input terminal of the AND circuit device D3 is a high-level signal. Thus, at this time the AND circuit device D3 outputs 0, that is, the control signal is a low-level voltage signal. When the scan chip needs to turn on another scan lines, the out terminal of the nth level buffer D4 outputs a high-level voltage signal VGL, the comparison signal output from the comparator D1 is a low-level voltage signal. The inverter D2 reverses the comparison signal of the low-level to output the first intermediate signal of high-level, that is, the first input terminal of the AND circuit device D3 receives a high-level signal, and the second input terminal of the AND circuit receives a low-level signal, thus at this time the AND circuit device D3 outputs 0, that is the control signal is a low-level voltage signal.

If a short circuit occurs between nth row scan line and its adjacent scan line, it is assumed that a short circuit occurs between the nth row scan line and the (n+1)th row scan line. When the scan chip needs to turn on nth row scan line, the out terminal of the nth level buffer D4 outputs a high-level voltage signal VGH. The comparison signal generated by the comparator D1 according to the high-level signal VGH and the low-level voltage signal VGL is a high-level signal. The inverter D2 reverses the comparison signal of high-level to generate the first intermediate signal of low-level, that is, the first input terminal of the AND circuit device D3 receives a low-level voltage signal, and the second input terminal of the AND circuit receives a high-level signal, thus the AND circuit device D3 outputs 0, that is, the control signal is a low-level voltage signal.

When the scan chip needs to turn on (n+1)/(n−1)th row scan line, the out terminal of the (n+1)/(n−1)th level buffer D4 outputs a high-level voltage signal VGH, the out terminal of the nth level buffer D4 outputs a high-level signal VGL. However, since a short circuit occurs between nth row scan line and (n+1)/(n−1)th row scan line, the voltage output from the output terminal of the nth level buffer D4 approaches the high-level voltage signal VGH, and is larger than the lower level voltage signal VGL. Thus, at this time the comparison signal output from the comparator D1 is a high-level signal. The inverter D2 reverses a comparison signal of high-level to output the first intermediate signal of low-level signal, that is, a low-level voltage signal is input to the first input terminal of the AND circuit device D3, and a low-level voltage signal is input to the second input terminal of the AND circuit device. Thus, the AND circuit device D3 outputs 1, that is the control signal is a high-level signal. Thus, the scan chip can turn off according to the control signal when a short circuit occurs, thereby avoiding burning out the scan chip due to a short circuit between scan lines.

Based on a same invention concept, the present application provides a scan drive circuit, the scan drive circuit includes a detection circuit of any one of above embodiments.

In this embodiment, the scan drive circuit includes a buffer D4 and at least one detection circuit. The detection circuit includes a comparison circuit 100 and a determination circuit 200.

A first input terminal of the comparison circuit 100 is connected to an output terminal of an nth level buffer D4 in a scan chip and is configured to receive the scan output signal G_out output from the output terminal of the nth level buffer D4, and a second input terminal of the comparison circuit 100 is configured to receive a low-level voltage signal VGL. The comparison circuit 100 is configured to generate a first intermediate signal according to the scan output signal G_out and the low-level voltage signal VGL received.

A first input terminal of the determination circuit 200 is connected to an output terminal of the comparison circuit 100 and is configured to receive the first intermediate signal output from the output terminal of the comparison circuit 100, a second input terminal of the determination circuit 200 is connected to the input terminal of the nth level buffer D4 in the scan chip and is configured to receive a scan input signal G_in of the nth level buffer D4 output from the input terminal of the nth level buffer D4 in the scan chip. The determination circuit 200 is configured to generate a control signal according to the first intermediate signal and the scan input signal G_in of the nth level buffer D4, and output the control signal to the scan chip to control the scan chip to cut off output when a short circuit occurs.

In one of the embodiments, the comparison circuit 100 includes a comparison branch 110, a first input terminal of the comparison branch 110 is connected to the output terminal of the nth level buffer D4 in the scan chip and is configured to receive the scan output signal G_out output from the output terminal of the nth level buffer D4, and a second input terminal of the comparison branch 110 is configured to receive the low-level voltage signal VGL, and an output terminal of the comparison branch 110 is connected to the first input terminal of the determination circuit 200. The comparison branch 110 is configured to generate the first intermediate signal according to the scan output signal G_out and the low-level voltage signal VGL received.

In one of the embodiments, the determination 200 unit includes a signal processing branch 210 and a logic determination branch 220.

An input terminal of the signal processing branch 210 is connected to the input terminal of the nth level buffer D4 in the scan chip, and the signal processing branch 210 is configured to receive the scan input signal G_in of the nth level buffer D4 output from the input terminal of the nth level buffer D4 in the scan chip, and reverse the scan input signal G_in of the nth level buffer D4.

A first input terminal of the logic determination branch 220 is connected to the output terminal of the comparison branch 110, a second input terminal of the logic determination branch 220 is connected to an output terminal of the signal processing branch 210. The logic determination branch 220 is configured to receive the first intermediate signal and the scan input signal G_in of the nth level buffer D4 after being reversed, and generate the control signal according to the first intermediate signal and the scan input signal G_in of the nth level buffer D4 after being reversed, and output the control signal to the scan chip.

In one of the embodiments, the comparison branch 110 includes a comparator D1, A positive input terminal of the comparator D1 is connected to the output terminal of the nth level buffer D4 in the scan chip, a negative input terminal of the comparator D1 is configured to receive the low-level voltage signal VGL, and an output terminal of the comparator D1 is connected to the first input terminal of the logical determination branch.

In one of the embodiments, the signal processing branch 210 includes an inverter D2, the input terminal of the inverter D2 is connected to the input terminal of the nth level buffer D4 in the scan chip, the output terminal of the inverter D2 is connected to the second input terminal of the logic determination branch 220.

In one of the embodiments, the logic determination branch 220 includes an AND circuit device D3. A first input terminal of the AND circuit device D3 is connected to the output terminal of the comparator D1, and a second input terminal of the AND circuit device D3 is connected to the output terminal of the inverter D2.

Please refer to FIG. 6, the scan chip includes an N level buffer D4. When the scan chip needs to turn on an nth row scan line (where n and N are integers greater than or equal to 1, and 1≤n≤N), the scan input signal G_in from the input terminal of the nth level buffer D4 is a high-level signal, a first switch tube T1 (which is an N-type FET) is turned on, and a second switch tube T2 (which is a P-type FET) is turned off, then the nth level buffer D4 in the scan chip outputs a high-level voltage signal VGH to the nth row scan line. When scanning to the next row or another row, the first switch tube T1 (which is the N-type FET) of the nth level buffer D4 is turned off, and the second switch tube T2 (which is the P-type FET) is turned on, then the scan output signal G_out output from the output terminal of the nth level buffer D4 in the scan chip is a low-level voltage signal VGL and is provided to the nth row scan line.

When a short circuit occurs between scan lines (it is assumed that a short circuit occurs between an nth row scan line and an (n+1)th row scan line), when the scan chip needs to turn on (n+1)th row can line, a low-level voltage signal VGL is provided to the nth row scan line by an nth row level buffer D4, and a high-level signal VGH is provided to the (n+1)th row scan line by an (n+1)th level buffer D4. However, since a short circuit occurs between the nth row scan line and the (n+1)th row scan line, the voltage output from the output terminal of the nth row level buffer D4 approaches the voltage of the high-level voltage signal VGH, and is larger than the low level voltage signal VGL.

In this embodiment, in a normal working state, when the scan chip needs to turn on the nth row scan line, the out terminal of the nth level buffer D4 outputs a high-level voltage signal VGH, and a first intermediate signal generated by the comparator D1 according to the high-level voltage signal VGH and the low-level voltage signal VGL is a high-level signal. The input terminal of the inverter D2 receives the high-level voltage signal VGH, and the high-level voltage signal VGH is reversed to a low-level voltage signal, that is, the first input terminal of the AND circuit device D3 receives a high-level signal, and the second input terminal of the AND circuit device receives a low-level voltage signal, thus, the AND circuit device D3 outputs 0, that is, the control signal is a low-level voltage signal. When the scan chip needs to turn on another scan lines, the out terminal of the nth level buffer D4 outputs a high-level voltage signal VGL, a first intermediate signal output from the comparator D1 is a low-level voltage signal. The low-level voltage signal is input to the input terminal of the inverter D2, and the inverter D2 outputs a high-level signal, that is, the first input terminal of the AND circuit device D3 receives a low-level voltage signal, and the second input terminal of the AND circuit receives a high-level signal, thus the AND circuit device D3 outputs 0, that is, the control signal is a low-level voltage signal.

If a short circuit occurs between the nth row scan line and its adjacent scan line, it is assumed that a short circuit occurs between the nth row scan line and the (n+1)th row scan line. When the scan chip needs to turn on the nth row scan line, the out terminal of the nth level buffer D4 outputs a high-level voltage signal VGH, a first intermediate signal generated by the comparator D1 according to the high-level signal VGH and the low-level voltage signal VGL is a high-level signal. The input terminal of the inverter D2 receives the high-level signal VGH, and the high-level signal VGH is reversed to a low-level voltage signal, that is, the first input terminal of the AND circuit device D3 receives a high-level signal, and the second input terminal of the AND circuit device receives a low-level voltage signal, thus the AND circuit device D3 outputs 0, that is, the control signal is a low-level voltage signal.

When the scan chip needs to turn on an (n+1)/(n−1)th row scan line, the (n+1)/(n−1)th level buffer D4 outputs a high-level voltage signal VGH, the out terminal of the nth level buffer D4 outputs a low-level voltage signal VGL. However, since a short circuit occurs between the nth row scan line and the (n+1)/(n−1)th row scan line, the voltage of the output terminal of the nth level buffer D4 approaches the high-level voltage signal VGH and is larger than the lower level voltage signal VGL. Thus, at this time the first intermediate signal output from the comparator D1 is a high-level signal. A low-level voltage signal is input to the input terminal of the inverter D2, and the inverter D2 outputs a high-level signal, that is, the first input terminal of the AND circuit device D3 receives a high-level signal, and the second input terminal of the AND circuit receives a high-level signal. Thus, the scan chip can turn off according to the control signal when a short circuit occurs, thereby avoiding burning out the scan chip due to a short circuit between scan lines.

The present application also provides another one scan drive circuit. Please refer to FIG. 7, the comparison circuit 100 of the scan drive includes a comparison branch 110 and a signal processing branch 210.

a first input terminal of the comparison branch 110 is connected to an output terminal of the nth level buffer D4 in the scan chip and is configured to receive the scan output signal G_out output from the output terminal of the nth level buffer D4, and a second input terminal of the comparison branch 110 is configured to receive a low-level voltage signal VGL. The comparison branch 110 is configured to generate a comparison signal according to the scan output signal G_out and the low-level voltage signal VGL received.

An input terminal of the signal processing branch 210 is connected to an output terminal of the comparison branch 110 and is configured to receive the comparison signal, and reverses the comparison signal to generate the first intermediate signal, an output terminal of the signal processing branch 210 is connected to the first input terminal of the determination circuit 200 and is configured to provide the first intermediate signal to the determination circuit. In this embodiment, the determination circuit 200 includes a logic determination branch 220, a first input terminal of the logic determination branch 220 is connected to the input terminal of the signal processing branch 210, and a second input terminal of the logic determination branch 220 is connected to an input terminal of the nth level buffer D4 in the scan chip. The logic determination branch 220 is configured to receive the intermediate signal and the scan input signal G_in of the nth level buffer D4, and generate the control signal according to the first intermediate signal and the scan input signal G_in of the nth level buffer D4, and output the control signal to the chip signal.

In one of the embodiments, the comparison branch 110 includes a comparator D1. The signal processing branch 210 includes an inverter D2. The logic determination branch 220 includes an AND circuit device D3.

A positive input terminal of the comparator D1 is connected to the output terminal of the nth level buffer D4 in the scan chip, a negative input terminal of the comparator D1 is connected to a low-level voltage signal VGL, and an output terminal of the comparator is connected to an input terminal of the inverter D2.

A first input terminal of the AND circuit device D3 is connected to the output terminal of the inverter D2, and a second input terminal of the AND circuit device is connected to the input terminal of the nth level buffer D4 in the scan chip.

In this embodiment, in normal working state, when the scan chip needs to turn on nth row scan line, the out terminal of the nth level buffer D4 outputs the high-level voltage signal VGH, and the comparison signal of high-level generated by the comparator D1 according to the high-level signal VGH and the low-level voltage signal VGL, the inverter D2 reverses the comparison signal of the high-level to generate the first intermediate signal of the low-level, that is, the first input terminal of the AND circuit device D3 receives a low-level voltage signal. The second input terminal of the AND circuit device D3 receives a high-level signal. Thus, at this time the AND circuit device D3 outputs 0, that is, the control signal is a low-level voltage signal. When the scan chip needs to turn on other scan lines, the out terminal of the nth level buffer D4 outputs a high-level voltage signal VGL, the comparison signal output from the comparator D1 is a low-level voltage signal. The inverter D2 reverses the comparison signal of the low-level to output the first intermediate signal of high-level, that is, the first intermediate input terminal of the AND circuit device D3 receives a high-level signal, and the second input terminal of the AND circuit device receives a low-level signal, thus at this time the AND circuit device D3 outputs 0, that is the control signal is a low-level voltage signal.

If a short circuit occurs between an nth row scan line and its adjacent scan line, it is assumed that a short circuit occurs between the nth row scan line and the (n+1)th row scan line. When the scan chip needs to turn on the nth row scan line, the out terminal of the nth level buffer D4 outputs a high-level voltage signal VGH. The comparison signal generated by the comparator D1 according to the high-level signal VGH and the low-level voltage signal VGL is a high-level signal. The inverter D2 processes the comparison signal of high-level to generate the first intermediate signal of low-level, that is, the first input terminal of the AND circuit device D3 receives a low-level voltage signal, and the second input terminal of the AND circuit receives a high-level signal, thus the AND circuit device D3 outputs 0, that is, the control signal is a low-level voltage signal.

When the scan chip needs to turn on (n+1)/(n−1)th row scan line, the (n+1)/(n−1)th level buffer D4 outputs a high-level voltage signal VGH, the out terminal of the nth level buffer D4 outputs a high-level signal VGL. However, since a short circuit occurs between nth row scan line and (n+1)/(n−1)th row scan line, the voltage of the output terminal of the nth level buffer D4 approaches the high-level voltage signal VGH, the lower level voltage signal VGL is larges. Thus, at this time the comparison signal output from the comparator D1 is a high-level signal. The inverter D2 reverses a comparison signal of high-level to output the first intermediate signal of the low-level signal, that is, the first input terminal of the AND circuit device D3 receives a low-level voltage signal, and the second input terminal of the AND circuit device receives a low-level voltage signal. Thus, the AND circuit device D3 outputs 1, that is the control signal is a high-level signal. Thus, the scan chip can turn off according to the control signal when a short circuit occurs, thereby avoiding burning out the scan chip due to a short circuit between scan lines.

As the mentioned-above, the present application provides a detection circuit and scan drive circuit. The detection circuit includes a comparison circuit 100 and a determination circuit 200.

A first input terminal of the comparison circuit 100 is connected to an output terminal of an nth level buffer D4 in a scan chip and is configured to receive the scan output signal G_out output from the output terminal of the nth level buffer D4, and a second input terminal of the comparison circuit 100 is configured to receive a low-level voltage signal VGL. The comparison circuit 100 is configured to generate a first intermediate signal according to the scan output signal G_out and the low-level voltage signal VGL received. A first input terminal of the determination circuit 200 is connected to an output terminal of the comparison circuit 100 and is configured to receive the first intermediate signal output from the output terminal of the comparison circuit 100, a second input terminal of the determination circuit 200 is connected to the input terminal of the nth level buffer D4 in the scan chip and is configured to receive the scan input signal G_in of the nth level buffer D4 output from the input terminal of the nth level buffer D4 in the scan chip, the determination circuit 200 is configured to generate a control signal according to the first intermediate signal and the scan input signal G_in of the nth level buffer D4, and output the control signal to the scan chip to control the scan chip to turn off when a short circuit occurs. In the present application, the comparison circuit 100 generates a first intermediate signal according to the low-level voltage signal VGL and the scan output signal G_out output from the output terminal of the nth level buffer D4, and the determination circuit 200 generates a control signal according to the first intermediate signal and the scan input signal of the nth level buffer D4, and outputs the control signal to the scan chip to control the scan chip to cut off output when a short circuit occurs, thereby avoiding burning out the scan chip due to a short circuit between scan lines.

The various technical features of the above-mentioned embodiments can be combined arbitrarily. In order to make the description concise, not all possible combinations of the various technical features in the above-mentioned embodiments are described. However, as long as there is no contradiction in the combinations of these technical features, all should be considered to be within the scope of this specification.

The above-mentioned embodiments only express a few implementation modes of the present application, and their description is relatively specific and detailed, but they should not be understood as a limitation on the scope of the patent application. It should be pointed out that for those of ordinary skill in the art, several modifications and improvements can be made without departing from the concept of the present invention, and these all fall within the protection scope of this application. Therefore, the protection scope of the patent of the present application shall be subject to the appended claims.

What is claimed is:

1. A detection circuit, comprising:
a comparison circuit, a first input terminal of the comparison circuit connected to an output terminal of an nth level buffer in a scan chip being configured to receive a scan output signal output from the output terminal of the nth level buffer, and a second input terminal of the comparison circuit being configured to receive the low-level voltage signal, and the comparison circuit being configured to generate a first intermediate signal according to the scan output signal and the low-level voltage signal received; and
a determination circuit, a first input terminal of the determination circuit connected to an output terminal of the comparison circuit being configured to receive the first intermediate signal output from the output terminal of the comparison circuit, a second input terminal of the determination circuit connected to an input terminal of the nth level buffer in the scan chip being configured to receive the scan input signal of the nth level buffer output from the input terminal of the nth level buffer in the scan chip, and reverse the scan input signal of the nth level buffer, the determination circuit being configured to generate a control signal according to the first intermediate signal and the scan input signal of the nth level buffer received after being reversed, and output the control signal to the scan chip to control the scan chip to cut off output when a short circuit occurs.

2. The detection circuit of claim 1, wherein the comparison circuit comprises:
a comparison branch, a first input terminal of the comparison branch connected to the output terminal of the nth level buffer in the scan chip being configured to receive the scan output signal output from the output terminal of the nth level buffer, and a second input terminal of the comparison branch being configured to receive the low-level voltage signal, and the comparison branch being configured to generate the first intermediate signal according to the scan output signal and the low-level voltage signal received.

3. The detection circuit of claim 2, wherein the determination circuit comprises:
a signal processing branch, an input terminal of the signal processing branch connected to the input terminal of the nth level buffer in the scan chip being configured to receive the scan input signal of the nth level buffer output from the input terminal of the nth level buffer in the scan chip, and reverse the scan input signal of the nth level buffer; and
a logic determination branch, a first input terminal of the logic determination branch connected to the output terminal of the comparison branch being configured to receive the first intermediate signal, a second input terminal of the logic determination branch connected to the input terminal of the signal processing branch being configured to receive the scan input signal of the nth level buffer after being reversed, the logic determination branch being configured to generate the control signal according to the first intermediate signal and the scan input signal of the nth level buffer after being reversed, and output the control signal to the scan chip.

4. The detection circuit of claim 3, wherein the comparison branch comprises a comparator, a positive input terminal of the comparator being connected to the output terminal of the nth level buffer in the scan chip, a negative input terminal of the comparator being configured to receive the low-level voltage signal, and the output terminal of the comparator being connected to the first input terminal of the logic determination branch.

5. The detection circuit of claim 4, wherein the signal processing branch comprises an inverter, an input terminal of the inverter being connected to the input terminal of the nth level buffer in the scan chip, and an output terminal of the inverter being connected to the second input terminal of the logic determination branch.

6. The detection circuit of claim 4, wherein the logic determination branch comprises an AND circuit device, a first input terminal of the AND circuit device being connected to the output terminal of the comparator, a second input terminal of the AND circuit device being connected to the output terminal of the inverter.

7. A scan drive circuit comprising at least one detection circuit, wherein the detection circuit comprises:
a comparison circuit, a first input terminal of the comparison circuit connected to an output terminal of an nth level buffer in a scan chip being configured to receive a scan output signal output from the output terminal of the nth level buffer, and a second input terminal of the comparison circuit being configured to receive the low-level voltage signal, and the comparison circuit being configured to generate a first intermediate signal according to the scan output signal and the low-level voltage signal received; and
a determination circuit, a first input terminal of the determination circuit connected to an output terminal of the comparison circuit being configured to receive the first intermediate signal output from the output terminal of the comparison circuit, a second input terminal of the determination circuit connected to an input terminal of the nth level buffer in the scan chip being configured to receive the scan input signal of the nth level buffer output from the input terminal of the nth level buffer in the scan chip, and reverse the scan input signal of the nth level buffer, the determination circuit being configured to generate a control signal according to the first intermediate signal and the scan input signal of the nth level buffer received after being reversed, and output the control signal to the scan chip to control the scan chip to cut off output when a short circuit occurs.

8. The scan drive circuit of claim 7, wherein the comparison circuit comprises:
a comparison branch, a first input terminal of the comparison branch connected to the output terminal of the nth level buffer in the scan chip being configured to receive the scan output signal output from the output terminal of the nth level buffer, and a second input terminal of the comparison branch being configured to receive the low-level voltage signal, and the comparison branch being configured to generate the first intermediate signal according to the scan output signal and the low-level voltage signal received.

9. The scan drive circuit of claim 8, wherein the determination circuit comprises:
a signal processing branch, an input terminal of the signal processing branch connected to the input terminal of the nth level buffer in the scan chip being configured to receive the scan input signal of the nth level buffer output from the input terminal of the nth level buffer in the scan chip, and reverse the scan input signal of the nth level buffer; and
a logic determination branch, a first input terminal of the logic determination branch connected to the output terminal of the comparison branch being configured to receive the first intermediate signal, a second input terminal of the logic determination branch connected to the input terminal of the signal processing branch being configured to receive the scan input signal of the nth level buffer after being reversed, the logic determination branch being configured to generate the control signal according to the first intermediate signal and the scan input signal of the nth level buffer after being reversed, and output the control signal to the scan chip.

10. The scan drive circuit of claim 9, wherein the comparison branch comprises a comparator, a positive input terminal of the comparator being connected to the output terminal of the nth level buffer in the scan chip, a negative input terminal of the comparator being configured to receive the low-level voltage signal, and the output terminal of the comparator being connected to the first input terminal of the logic determination branch.

11. The scan drive circuit of claim 10, wherein the signal processing branch comprises an inverter, an input terminal of the inverter being connected to the input terminal of the nth level buffer in the scan chip, and an output terminal of the inverter being connected to the second input terminal of the logic determination branch.

12. The scan drive circuit of claim 11, wherein the logic determination branch comprises an AND circuit device, a first input terminal of the AND circuit device being connected to the output terminal of the comparator, a second input terminal of the AND circuit device being connected to the output terminal of the inverter.

* * * * *